United States Patent
Park et al.

(10) Patent No.: US 11,716,027 B2
(45) Date of Patent: Aug. 1, 2023

(54) DUAL POLARITY POWER SUPPLY DEVICE

(71) Applicant: Microsoft Technology Licensing, LLC, Redmond, WA (US)

(72) Inventors: Chang Joon Park, Sunnyvale, CA (US); Martin Francis Galinski, III, Mountain View, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 54 days.

(21) Appl. No.: 17/456,154

(22) Filed: Nov. 22, 2021

(65) Prior Publication Data
US 2023/0163690 A1 May 25, 2023

(51) Int. Cl.
| | | |
|---|---|---|
| H02M 3/158 | (2006.01) | |
| H02M 3/07 | (2006.01) | |
| H02M 1/00 | (2006.01) | |
| G09G 3/36 | (2006.01) | |
| G01R 19/165 | (2006.01) | |
| G02B 27/01 | (2006.01) | |
| G05F 1/575 | (2006.01) | |

(52) U.S. Cl.
CPC .... *H02M 3/1584* (2013.01); *G01R 19/16538* (2013.01); *G02B 27/017* (2013.01); *G05F 1/575* (2013.01); *G09G 3/3696* (2013.01); *H02M 1/0025* (2021.05); *H02M 3/071* (2021.05)

(58) Field of Classification Search
None
See application file for complete search history.

(56) References Cited

U.S. PATENT DOCUMENTS

| | | | | |
|---|---|---|---|---|
| 6,661,211 B1 * | 12/2003 | Currelly | ............... | H02M 1/36 |
| | | | | 323/901 |
| 10,756,628 B2 * | 8/2020 | Cuenca | ............... | H02M 3/156 |
| 10,877,500 B2 * | 12/2020 | Wang | ................ | G05F 1/575 |

(Continued)

FOREIGN PATENT DOCUMENTS

| | | |
|---|---|---|
| CN | 101127483 B | 6/2010 |
| JP | 2006209295 A | 8/2006 |
| WO | 2018161663 A1 | 9/2018 |

OTHER PUBLICATIONS

"International Search Report and Written Opinion Issued in PCT Application No. PCT/US22/042303", dated Nov. 22, 2022, 11 Pages.

*Primary Examiner* — Jeffrey A Gblende
(74) *Attorney, Agent, or Firm* — Alleman Hall Creasman & Tuttle LLP

(57) ABSTRACT

A power supply device includes a switching converter, an inductor, and a linear voltage regulator. The inductor is electrically connected between a first switching node and a second switching node of the switching converter. The power supply device is configured such that when the switching converter is in an ON state the inductor is charged with a charging current. The power supply device is further configured such that when the switching converter is in an OFF state, the switching converter modulates an input voltage to generate a positive-bias output voltage at a positive-bias output node, the charging current flows from the inductor such that a negative input voltage is generated at a linear voltage regulator input node, and the linear voltage regulator regulates the negative input voltage to generate a negative-bias output voltage at a negative-bias output node.

20 Claims, 5 Drawing Sheets

(56) References Cited

U.S. PATENT DOCUMENTS

2007/0290657 A1\* 12/2007 Cretella .............. H02M 3/1584
  323/222
2014/0354349 A1   12/2014 Liu et al.
2018/0358886 A1\* 12/2018 Patterson .............. H02M 3/158

\* cited by examiner

DUAL POLARITY POWER SUPPLY DEVICE

BACKGROUND

Lower power consumption and smaller form factor designs are desirable in mixed reality (MR), augmented reality (AR), and virtual reality (VR) devices for longer battery life, portability, and comfort. Liquid Crystal on Silicon (LCoS) is one type of display technology that can be employed in such MR, AR, and VR devices to contribute to a small form factor and lower power consumption. Typically, an LCoS display is powered by a power supply that provides a dual polarity voltage—i.e., a positive bias voltage and a negative bias voltage.

SUMMARY

A power supply device includes a switching converter, an inductor, and a linear voltage regulator. The inductor is electrically connected between a first switching node and a second switching node of the switching converter. The power supply device is configured such that when the switching converter is in an ON state the inductor is charged with a charging current. The power supply device is further configured such that when the switching converter is in an OFF state, (1) the switching converter modulates an input voltage to generate a positive-bias output voltage at a positive-bias output node, (2) the charging current flows from the inductor such that a negative input voltage is generated at a linear voltage regulator input node, and (3) the linear voltage regulator regulates the negative input voltage to generate a negative-bias output voltage at a negative-bias output node.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

Liquid Crystal on Silicon (LCoS) display technology can be employed in mixed reality (MR), augmented reality (AR), and virtual reality (VR) devices to contribute to a small form factor design and low power consumption. Typically, an LCoS display is powered by a power supply that provides a dual polarity voltage—i.e., a positive bias voltage and a negative bias voltage. In one example, such a power supply device includes two separate switching converters that charge two discrete inductors to generate a positive bias voltage and a negative bias voltage for an LCoS display. The two discrete inductors are large and bulky relative to the other electronic components in the device, such that the two discrete inductors significantly contribute to an increase in size, weight, and power consumption of an MR, AR, or VR device that employs such a power supply device. Further, the two separate switching converters also contribute to such increases in size, weight, and power consumption.

Accordingly, the present description is directed to a dual polarity power supply device for generating a positive bias voltage and a negative bias voltage for an LCoS display (or another type of display that is powered using positive and negative bias voltages). The power supply device includes a single switching converter, a single discrete inductor, a low dropout voltage regulator, and other passive electronic components. The power supply device has a reduced size, weight, and power consumption relative to power supplies with two separate switching converters and two discrete inductors. In some implementations, the power supply device may be small enough to be integrated as part of an LCoS display module, as opposed to a separate discrete integrated circuit (IC). This integration into LCoS can further reduce the form factor, weight, and power consumption of an MR, AR, or VR device that employs such a display configuration.

Figure 1:
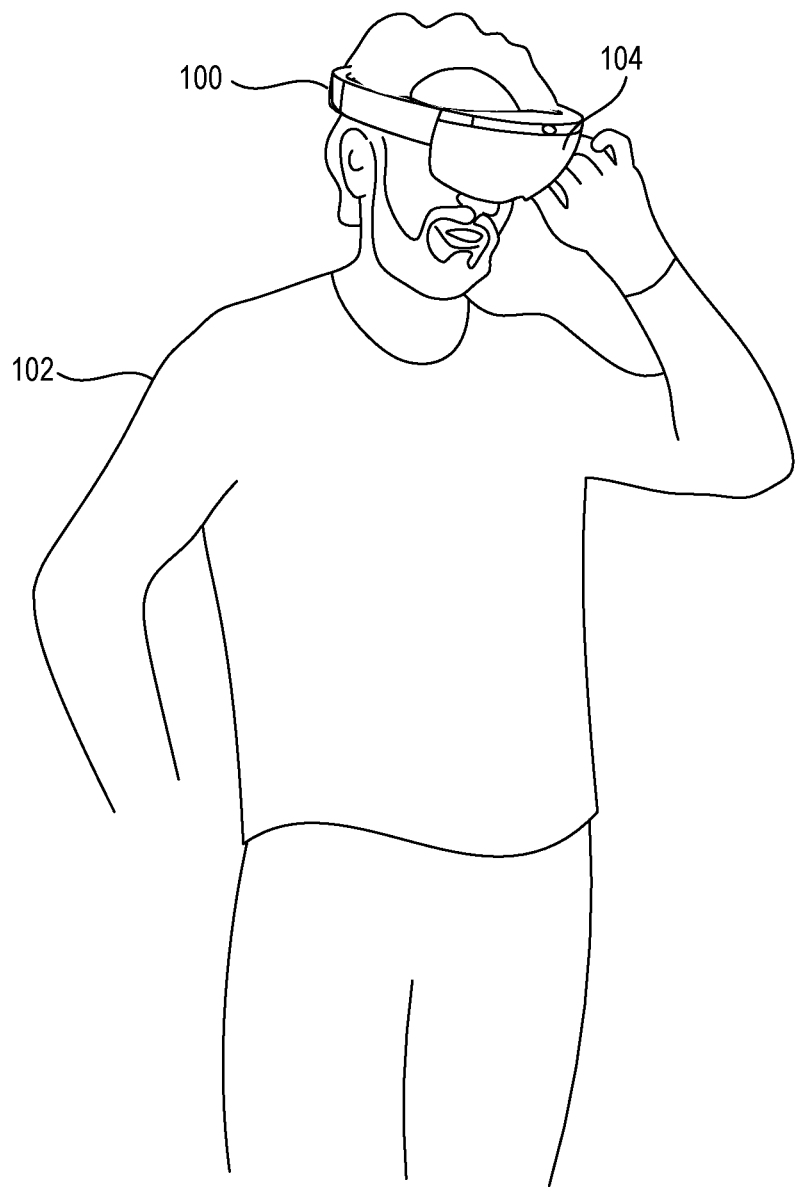
FIG. 1 shows an example head-mounted display device that may include a liquid crystal on silicon (LCoS) display that receives power from a dual polarity power supply device.

FIG. 1 shows an example near-eye display device 100 worn by a user 102. The near-eye display device 100 includes an LCoS display 104 configured to present virtual imagery to provide the user 102 with a MR/AR/VR experience. The near-eye display device 100 is provided as a non-limiting example of a display device having an LCoS display powered by a dual polarity power supply device. The disclosed examples of LCoS displays and dual polarity power supply devices may be implemented in any suitable type of display device.

Figure 2:
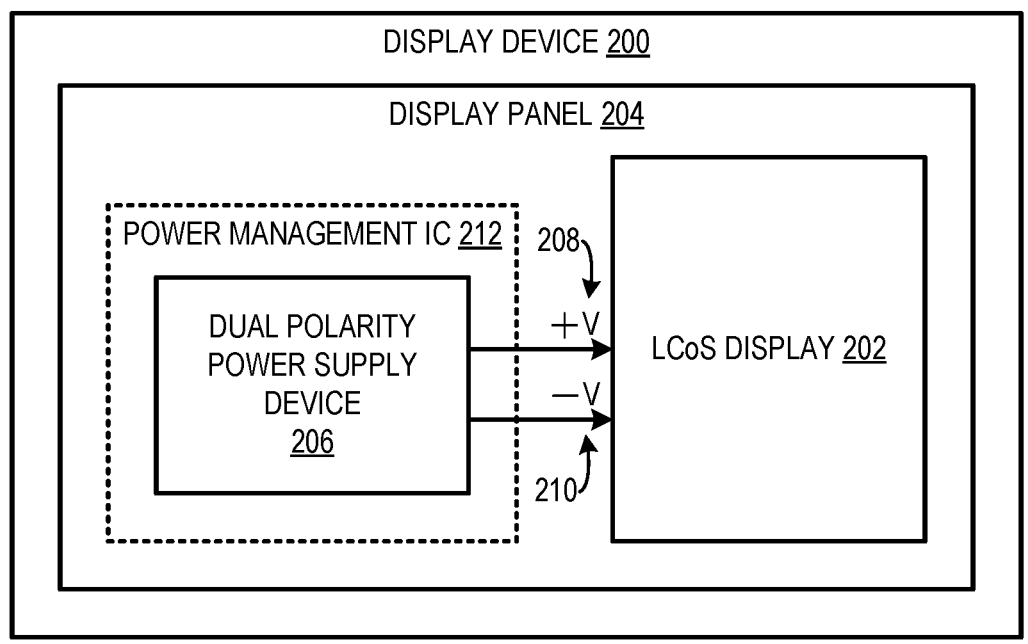
FIG. 2 shows a block diagram of an example display device including an LCoS display that is powered by a dual polarity power supply device.

FIG. 2 shows a block diagram of an example display device 200 including an LCoS display 202. In one example, the display device 200 is representative of the near-eye display device 100 shown in FIG. 1. In other examples, the display device 200 may be representative of another type of display device. The display device 200 be representative of any suitable type of display device. The LCoS display 202 is mounted on a display panel 204. The display panel 204 may include various electronic hardware modules and other electronic components that enable operation of the LCoS display 202. In some examples, such electronic hardware modules may include different integrated circuits (ICs) that are configured to perform display-specific operations.

The LCoS display 202 is configured to be powered by a dual polarity power supply device 206. The dual polarity power supply device 206 is configured to output a positive bias voltage 208 and a negative bias voltage 210 to control operation of the LCoS display 202. As discussed above, the dual polarity power supply device 206 has a configuration that is optimized for low power consumption and a small form factor in by employing a single switching converter and a single discrete inductor. Such gains may be realized relative to a dual converter power supply configuration that includes a first switching converter and a first discrete inductor to generate a positive bias voltage and a second switching converter and a second discrete inductor to generate a negative bias voltage.

In some implementations, the dual polarity power supply device 206 may have a small enough form factor to be integrated into a power management IC 212 that is mounted on-board the display panel 204 itself. Such integration may allow for an overall reduction in form factor of the display device 200 and reduced power consumption relative to an off-board configuration in which the dual polarity power supply device 206 is mounted on a separate off-board hardware panel. In other implementations, the dual polarity power supply device 206 may be mounted on a separate hardware panel that is electrically connected to the display panel 204 and the LCoS display 202.

Figure 3:
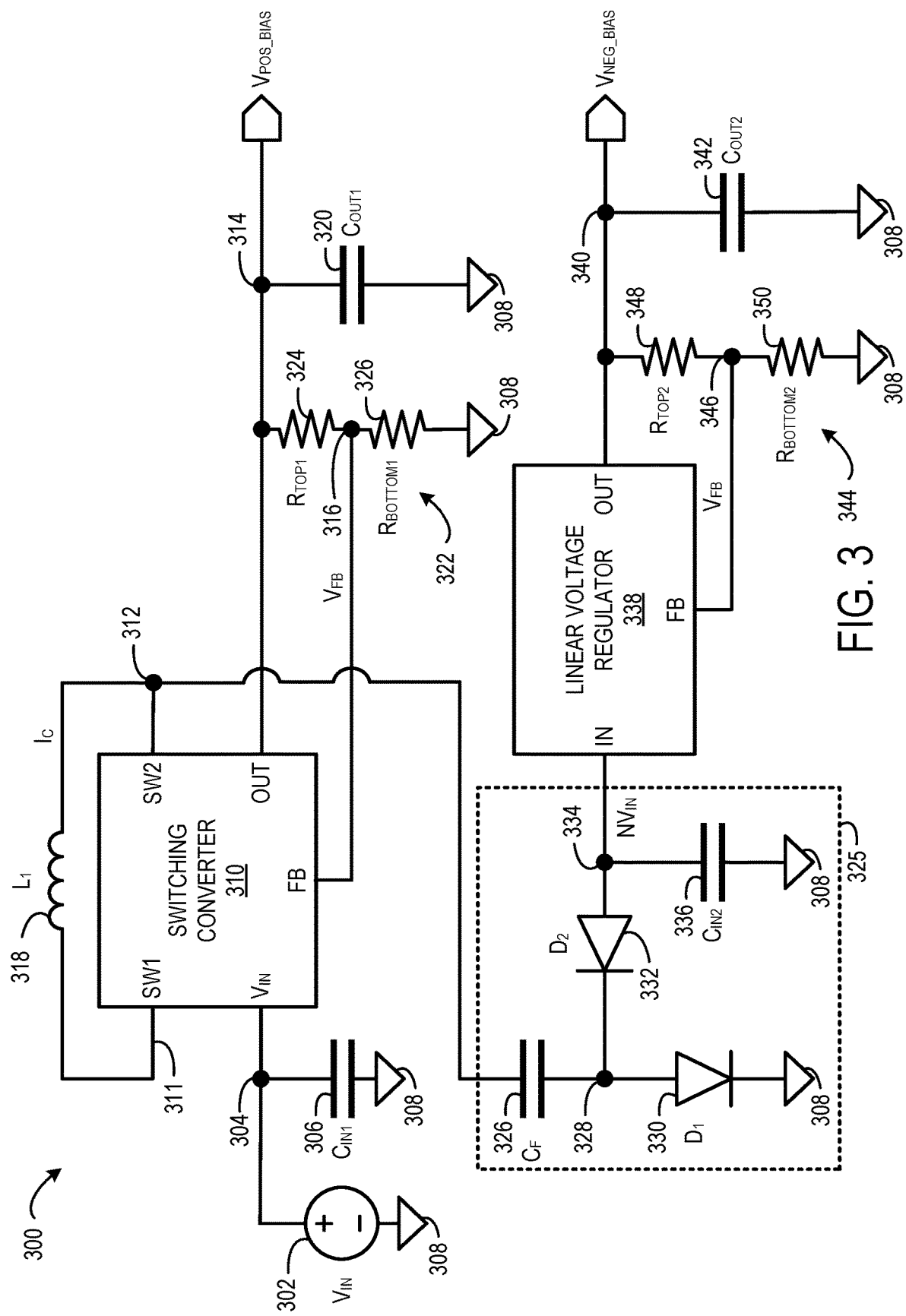
FIG. 3 shows a circuit diagram of an example dual polarity power supply device.

FIG. 3 shows a circuit diagram of an example dual polarity power supply device 300. In one example, the dual polarity power supply device 300 is representative of the dual polarity power supply device 206 shown in FIG. 2. The dual polarity power supply device 300 is configured to drive an LCoS display (or any other suitable display or system load) with different polarity bias voltages. The dual polarity power supply device 300 comprises a voltage source 302 configured to generate an input voltage ($V_{IN}$) at a switching converter input node 304 of a switching converter 310. The voltage source 302 may take any suitable form. For example, the voltage source 302 may be a direct current (DC) voltage source. In some examples, the voltage source may comprise an output of a digital micro-controller. In other examples, the voltage source may comprise a discrete electronic component. In yet another example, the voltage source may comprise one or more batteries.

A switching converter input capacitor 306 is electrically intermediate the switching converter input node 304 and a ground node 308. The switching converter input capacitor 306 has a capacitance ($C_{IN1}$). In one example, the capacitance ($C_{IN1}$) is selected to minimize effects of voltage ripple at the switching converter input node 304. The ground node 308 may be set to any suitable reference voltage. In one example, the reference voltage of the ground node is set to zero volts.

The switching converter 310 is electrically connected to the switching converter input node 304, which is electrically connected to the voltage source 302. The switching converter 310 is further electrically connected to a first switching node 311, a second switching node 312, a positive-bias output node 314, and a switching converter feedback node 316. An inductor 318 is electrically connected between the first switching node 311 and the second switching node 312. The inductor 318 has an inductance ($L_1$). A positive bias output capacitor 320 is electrically intermediate the positive-bias output node 314 and the ground node 308. The positive bias output capacitor 320 has a capacitance ($C_{OUT1}$). In one example, the capacitance ($C_{OUT1}$) is selected to minimize effects of voltage ripple at the positive-bias output node 314.

The switching converter 310 is configured to modulate voltage generated by the voltage source 302 from one voltage level (i.e., $V_{IN}$) to another voltage level by periodically storing energy in the inductor 318 and then releasing the stored energy to the positive-bias output node 314 at a different voltage level than the input voltage.

The switching converter 310 can include any suitable type of switching converter depending on the operational specifications of the device in which the dual polarity power supply device 300 is implemented. In some implementations, the switching converter 310 may include a buck switching converter that is configured to step down a higher input voltage ($V_{IN}$) to a lower positive-bias output voltage ($V_{POS\_BIAS}$). In some implementations, the switching converter 310 may include a boost switching converter that is configured to step up a lower input voltage ($V_{IN}$) to a higher positive-bias output voltage ($V_{POS\_BIAS}$). In some implementations, the switching converter 310 may include a buck-boost switching converter that is configured to reverse a polarity of the input voltage ($V_{IN}$) and either step up or step down the input voltage to the positive-bias output voltage ($V_{POS\_BIAS}$).

In some examples, the inductance ($L_1$) of the inductor 318 and the capacitance ($C_{OUT1}$) of the positive bias output capacitor 320 may be selected based on the input voltage ($V_{IN}$) and the positive-bias output voltage ($V_{POS\_BIAS}$) that are designated based on the design of the device in which the dual polarity power supply device 300 is implemented. Further, these passive components can be arranged in a variety of ways to realize the buck, boost, or buck-boost types of switching converter configurations.

The switching converter 310 is configured to switch between an ON state and an OFF state to modulate the input voltage ($V_{IN}$) and generate the positive-bias output voltage ($V_{POS\_BIAS}$). The dual polarity power supply device 300 is configured such that when the switching converter 310 is in the ON state the inductor 318 is charged with a charging current ($I_C$) that is stored in a magnetic field of the inductor 318. The power supply device is further configured such that when the switching converter is in the OFF state, the magnetic field of the inductor 318 collapses such that the switching converter 310 modulates the input voltage ($V_{IN}$) to generate the positive-bias output voltage ($V_{POS\_BIAS}$) at the positive-bias output node 314.

The switching converter 310 includes a first switch (not shown) electrically connected to the first switching node 311 and a second switch (not shown) electrically connected to the second switching node 312. In some implementations, the second switch of the switching converter 310 may include a transistor and the switching converter 310 may be synchronously rectified via the transistor. In other implementations, the switching converter 310 may employ a diode as the second switch.

The switching converter 310 may be configured to switch between the ON state and the OFF state via any suitable control scheme. In some implementations, the switching converter 310 may be controlled with a duty cycle that dictates a percentage of time that the switching converter 310 operates in the ON state relative to the OFF state. In other implementations, the switching converter 310 may be controlled based on a frequency of a control signal, such that an amount of time that the switching converter operates in the ON state and the OFF state is adjusted by adjusting the frequency of the control signal. In some implementations, two or more of the above example control schemes may be used in conjunction to control operation of the switching converter 310. In yet other examples, a different control scheme may be employed.

The power supply device 300 further comprises a switching converter feedback resistor divider 322 electrically connected between the positive-bias output node 314 and the switching converter feedback node 316. The resistor divider 322 includes a first resistor 324 electrically connected in series with a second resistor 326. The first resistor 324 is electrically connected between the positive-bias output node 314 and the switching converter feedback node 316. The first resistor 324 has a resistance ($R_{TOP1}$). The second resistor 326 is electrically connected between the switching converter feedback node 316 and the ground node 308. The second resistor 326 has a resistance ($R_{BOTTOM1}$). The switching converter feedback resistor divider 322 produces a feedback voltage ($V_{FB}$) that is proportional to the positive-bias output voltage ($V_{POS\_BIAS}$) based on the resistances ($R_{TOP1}$) and ($R_{BOTTOM1}$). The switching converter 310 is configured to modulate the positive-bias output voltage ($V_{POS\_BIAS}$) based on the feedback voltage ($V_{FB}$) measured via the resistor divider 322. For example, the switching converter 310 may increase the duty cycle based on the positive-bias output voltage ($V_{POS\_BIAS}$) being less than a desired voltage level and vice versa. In this way, the switching converter 310 modulates the input voltage ($V_{IN}$) to generate the positive-bias output voltage ($V_{POS\_BIAS}$) at the positive-bias output node 314.

The dual polarity power supply device 300 further comprises an inverting charge pump 325 electrically intermediate the second switching node 312 of the switching converter 310 and a linear voltage regulator input node 334 of a linear voltage regulator 338. The inverting charge pump 325 is configured to generate a negative input voltage ($NV_{IN}$) at the linear voltage regulator input node 334 of the linear voltage regulator 338.

The inverting charge pump 325 includes a flying capacitor 326 that is electrically connected between the second switching node 312 and an inverting charge pump node 328. The flying capacitor 326 has a capacitance ($C_F$). A first diode 330 is electrically connected between the inverting charge pump node 328 and the ground node 308. The first diode 330 is biased toward the ground node 308. A second diode 332 is electrically connected between the inverting charge pump node 328 and a linear voltage regulator input node 334 of a linear voltage regulator 338. The second diode 332 is biased toward the inverting charge pump node 328. A linear voltage regulator input capacitor 336 is electrically connected between the linear voltage regulator input node 334 and the ground node 308. The linear voltage regulator input capacitor 336 has a capacitance ($C_{IN2}$) In one example, the capacitance ($C_{IN2}$) is selected to minimize effects of voltage ripple at the linear voltage regulator input node 334.

The inverting charge pump 325 is configured such that when the switching converter 310 is in the ON state, the flying capacitor 326 is charged with the charging current ($I_C$). Further, when the switching converter 310 is in the OFF state, the charging current ($I_C$) flows from the flying capacitor 326 and is pulled through the second diode 332 to the linear voltage regulator input capacitor 336 to generate the negative input voltage ($NV_{IN}$) at the linear voltage regulator input node 334. In particular, the negative input voltage ($NV_{IN}$) is generated at the linear voltage regulator input node 334, because the absolute voltage level is less than the absolute voltage level at the first diode 330. Accordingly, the negative input voltage ($NV_{IN}$) is generated based on a signal output from the second switching node 312 of the switching converter 310. In other words, operation of the switching converter 310 controls generation of both the positive-bias output voltage ($V_{POS\_BIAS}$) and the negative input voltage ($NV_{IN}$) at the linear voltage regulator input node 334. Due to such an arrangement, a linear voltage regulator may be employed to regulate the negative input voltage ($NV_{IN}$) to generate the negative-bias output voltage ($V_{NEG\_BIAS}$) at the negative-bias output node 340.

The linear voltage regulator 338 is electrically connected to the linear voltage regulator input node 334. Further, the linear voltage regulator 338 is electrically connected to a negative-bias output node 340, and a linear voltage regulator feedback node 346. The linear voltage regulator 338 is configured to use a resistive voltage drop to regulate the negative input voltage ($NV_{IN}$) generated at the linear voltage regulator input node 334 to a desired negative-bias output voltage ($V_{NEG\_BIAS}$) at the negative-bias output node 340.

Unlike the switching converter 310, the linear voltage regulator 338 can only generate an output voltage that is lower than an input voltage of the linear voltage regulator. In some cases, such behavior could cause issues within a power supply device. However, in the case of the power supply device 300, the positive-bias output voltage ($V_{POS\_BIAS}$) is configured to have a greater absolute value than that of the negative-bias output voltage ($V_{NEG\_BIAS}$), so such issues do not factor into operation of the power supply device 300. Further, such behavior allows a linear voltage regulator to be used instead of a second switching converter to regulate the negative-bias output voltage. By employing a linear voltage regulator instead of a second switching converter, additional size and weight reductions may be realized for the dual polarity power supply device 300 as such a linear voltage regulator does not require an inductor or transformer. Likewise, a linear voltage regulator may have greater design simplicity relative to a switching converter. Moreover, a linear voltage regulator may operate with reduced signal noise relative to a switching converter (as no switching takes place in a linear voltage regulator). In some implementations, the linear voltage regulator 338 may include a low-dropout voltage regulator. A low-dropout voltage regulator may be configured to regulate a voltage even when the supply voltage level is very close to the output voltage level.

A negative bias output capacitor 342 is electrically intermediate the negative-bias output node 340 and the ground node 308. The negative bias output capacitor 342 has a capacitance ($C_{OUT2}$). In one example, the capacitance ($C_{OUT2}$) is selected to minimize effects of voltage ripple at the negative-bias output node 340.

The power supply device 300 further comprises a linear voltage regulator feedback resistor divider 344 electrically connected between the negative-bias output node 340 and the linear voltage regulator feedback node 346. The resistor divider 344 includes a first resistor 348 electrically connected in series with a second resistor 350. The first resistor 348 is electrically connected between the negative-bias output node 340 and the linear voltage regulator feedback node 346. The first resistor 348 has a resistance ($R_{TOP2}$). A second resistor 350 is electrically connected between the linear voltage regulator feedback node 346 and the ground node 308. The second resistor 350 has a resistance ($R_{BOTTOM2}$). The linear voltage regulator feedback resistor divider 344 produces a feedback voltage ($V_{FB}$) that is proportional to the negative-bias output voltage ($V_{NEG\_BIAS}$) based on the resistances ($R_{TOP2}$) and ($R_{BOTTOM2}$). The linear voltage regulator 338 is configured to regulate the negative-bias output voltage ($V_{NEG\_BIAS}$) based on the feedback voltage ($V_{FB}$) measured via the resistor divider 344. In this way, the linear voltage regulator 338 regulates the negative input voltage ($NV_{IN}$) to generate the negative-bias output voltage ($V_{NEG\_BIAS}$) at the negative-bias output node 340.

In some implementations, the positive-bias output node 314 may be electrically connected to a positive-bias input node of a LCoS display 202 (shown in FIG. 2). Likewise, the negative-bias output node 340 may be electrically connected to a negative-bias input node of the LCoS display 202 (shown in FIG. 2). In this way, the dual polarity power supply device 300 may be configured to output the positive-bias output voltage ($V_{POS\_BIAS}$) and the negative-bias output voltage ($V_{NEG\_BIAS}$) to the LCoS display 202 (shown in FIG. 2). In some implementations, the positive-bias output voltage ($V_{POS\_BIAS}$) has a greater absolute value than that of the negative-bias output voltage ($V_{NEG\_BIAS}$) based on the operation requirements of the LCoS display 202 (shown in FIG. 2). In one example, the positive-bias output voltage may be 6 volts and the negative-bias output voltage may be −3 volts. The positive-bias output voltage ($V_{POS\_BIAS}$) and the negative-bias output voltage ($V_{NEG\_BIAS}$) may be set to any suitable voltage levels.

The use of the single switching converter with the single inductor and the single linear voltage regulator in the dual polarity power supply device provides power efficient operation while also having a small form factor. In some implementations, such a configuration allows for the dual polarity power supply device to be incorporated into an IC, such as a power management IC that can be incorporated into a display panel of a near-eye display device. Also, in some implementations, such a configuration allows for the linear voltage regulator to be realized without an off-chip capacitor if the load current is not significant, as is typically the case for a LCoS display.

Although the dual polarity power supply device is discussed herein in the context of being used to power an LCoS display, the concepts discussed herein are broadly applicable to using the dual polarity power supply device to output dual polarity voltages to any suitable system load in an any suitable electronic device.

Figure 4:
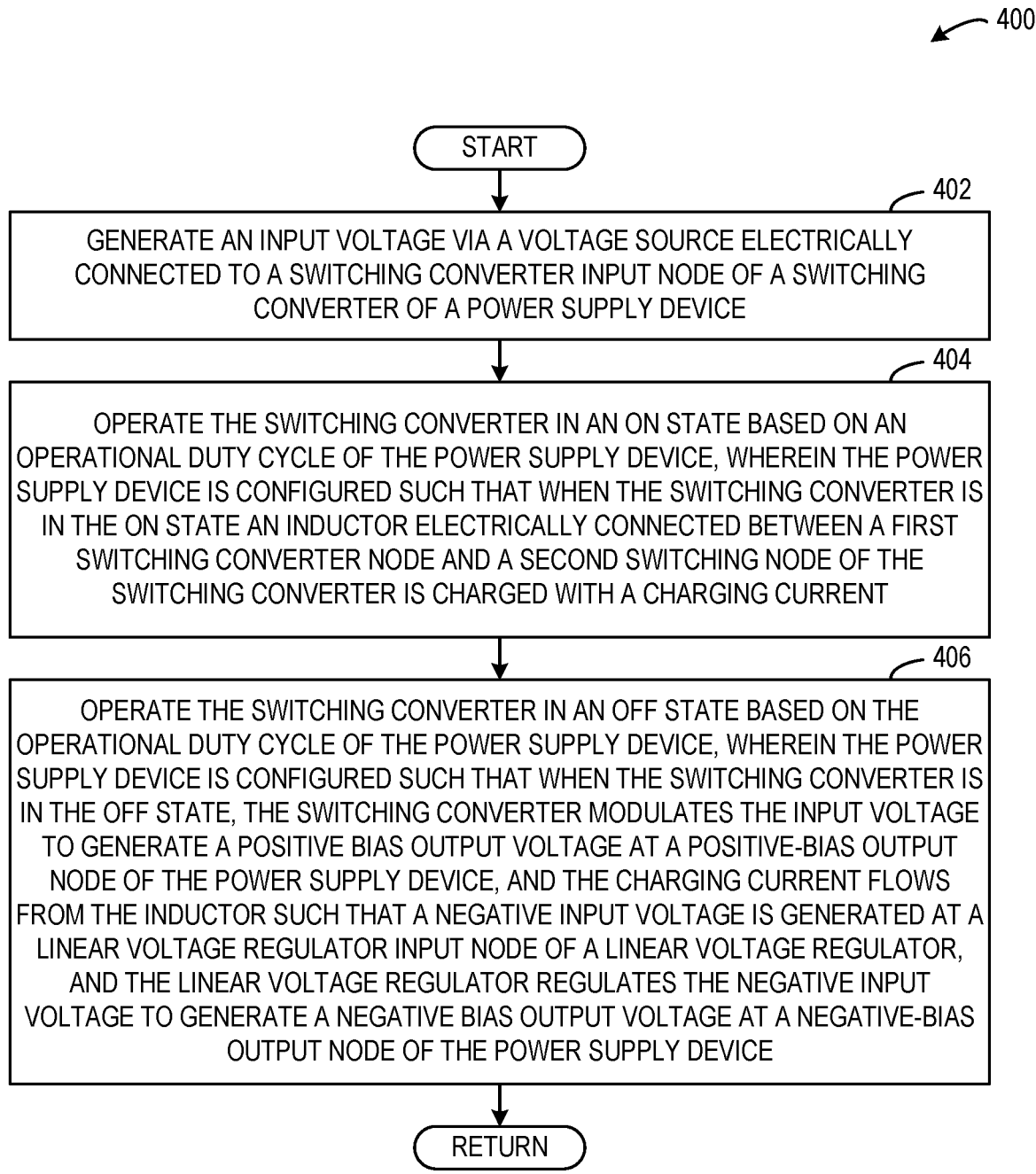
FIG. 4 shows a flowchart of an example method for controlling a dual polarity power supply device.

FIG. 4 shows an example method 400 of operating a power supply device. For example, the method 400 may be performed to operate the dual polarity power supply device 300 shown in FIG. 3.

At 402, the method 400 includes generating an input voltage via a voltage source electrically connected to a switching converter input node of a switching converter. For example, the switching converter may include a buck switching converter, a boost switching converter, or a buck-boost switching converter depending on the input voltage and a desired positive-bias output voltage. In some implementations, the switching converter may be synchronously rectified.

At 404, the method 400 includes operating the switching converter in an ON state based on an operational duty cycle of the power supply device. The power supply device may be configured such that when the switching converter is in the ON state an inductor electrically connected between a first switching converter node and a second switching node of the switching converter is charged with a charging current.

At 406, the method 400 includes operating the switching converter in an OFF state based on the operational duty cycle of the power supply device. The power supply device may be configured such that when the switching converter is in the OFF state, the switching converter modulates the input voltage to generate a positive-bias output voltage at a positive-bias output node of the power supply device. Further, in the OFF state, the charging current flows from the inductor such that a negative input voltage is generated at a linear voltage regulator input node. A linear voltage regulator regulates the negative input voltage to generate a negative-bias output voltage at a negative-bias output node of the power supply device.

In some implementations, the positive-bias output voltage and the negative-bias output voltage may be output to an LCoS display. In some implementations, the positive-bias output voltage and the negative-bias output voltage may be output to a different type of display that is configured to be powered using dual polarity voltages. In some implementations, the positive-bias output voltage may have a greater absolute value than that of the negative-bias output voltage. In one example, the positive-bias output voltage may be 6 volts and the negative-bias output voltage may be −3 volts.

In one example, the magnitudes of the bias voltages may be set based on the requirements of the display and/or other system load requirements.

In some implementations, the method may be performed repeatedly (or continuously) to output the positive bias voltage and the negative bias voltage according to the operational duty cycle of the switching converter. Further, in some implementations, the operational duty cycle of the switching converter may be adjusted based on feedback from a switching converter feedback resistor divider. Further, in some implementations, the linear voltage regulator may regulate the negative-bias output voltage based on feedback from a linear voltage regulator feedback resistor divider. In some implementations, the switching converter may be controlled by a different control scheme, such as a frequency-based control scheme.

In some implementations, the methods and processes described herein may be tied to a computing system of one or more computing devices. In particular, such methods and processes may be implemented as computer hardware, a computer-application program or service, an application-programming interface (API), a library, and/or other computer-program product.

Figure 5:
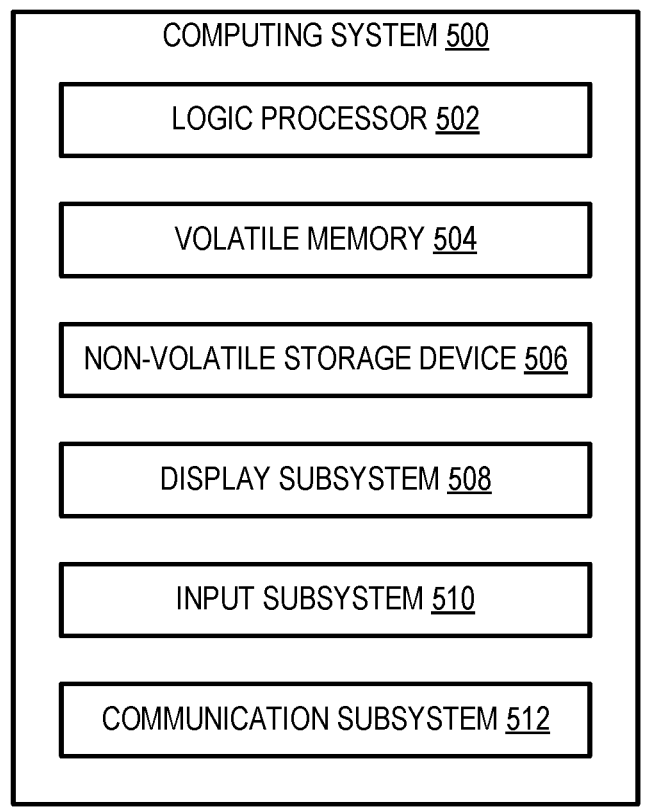
FIG. 5 shows an example computing system.

FIG. 5 schematically shows a non-limiting implementation of a computing system 500 that can enact one or more of the methods and processes described above. Computing system 500 is shown in simplified form. Computing system 500 may embody the near-eye display device 100 shown in FIG. 1, the display device 200 shown in FIG. 2, and any other suitable device that include the dual polarity power supply device described herein. Computing system 500 may take the form of one personal computers, server computers, tablet computers, home-entertainment computers, network computing devices, gaming devices, mobile computing devices, mobile communication devices (e.g., smart phone), and/or other computing devices, and wearable computing devices such as head-mounted, near-eye augmented/mixed/virtual reality devices.

Computing system 500 includes a logic processor 502, volatile memory 504, and a non-volatile storage device 506. Computing system 500 may optionally include a display subsystem 508, input subsystem 510, communication subsystem 512, and/or other components not shown in FIG. 5.

Logic processor 502 includes one or more physical devices configured to execute instructions. For example, the logic processor may be configured to execute instructions that are part of one or more applications, programs, routines, libraries, objects, components, data structures, or other logical constructs. Such instructions may be implemented to perform a task, implement a data type, transform the state of one or more components, achieve a technical effect, or otherwise arrive at a desired result.

The logic processor 502 may include one or more physical processors (hardware) configured to execute software instructions. Additionally or alternatively, the logic processor may include one or more hardware logic circuits or firmware devices configured to execute hardware-implemented logic or firmware instructions. Processors of the logic processor 502 may be single-core or multi-core, and the instructions executed thereon may be configured for sequential, parallel, and/or distributed processing. Individual components of the logic processor optionally may be distributed among two or more separate devices, which may be remotely located and/or configured for coordinated processing. Aspects of the logic processor may be virtualized and executed by remotely accessible, networked computing devices configured in a cloud-computing configuration. In such a case, these virtualized aspects are run on different physical logic processors of various different machines, it will be understood.

Non-volatile storage device 506 includes one or more physical devices configured to hold instructions executable by the logic processors to implement the methods and processes described herein. When such methods and processes are implemented, the state of non-volatile storage device 506 may be transformed—e.g., to hold different data.

Non-volatile storage device 506 may include physical devices that are removable and/or built-in. Non-volatile storage device 506 may include optical memory (e.g., CD, DVD, HD-DVD, Blu-Ray Disc, etc.), semiconductor memory (e.g., ROM, EPROM, EEPROM, FLASH memory, etc.), and/or magnetic memory (e.g., hard-disk drive, floppy-disk drive, tape drive, MRAM, etc.), or other mass storage device technology. Non-volatile storage device 506 may include nonvolatile, dynamic, static, read/write, read-only, sequential-access, location-addressable, file-addressable, and/or content-addressable devices. It will be appreciated that non-volatile storage device 506 is configured to hold instructions even when power is cut to the non-volatile storage device 506.

Volatile memory 504 may include physical devices that include random access memory. Volatile memory 504 is typically utilized by logic processor 502 to temporarily store information during processing of software instructions. It will be appreciated that volatile memory 504 typically does not continue to store instructions when power is cut to the volatile memory 504.

Aspects of logic processor 502, volatile memory 504, and non-volatile storage device 506 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

When included, display subsystem 508 may be used to present a visual representation of data held by non-volatile storage device 506. The visual representation may take the form of a graphical user interface (GUI). As the herein described methods and processes change the data held by the non-volatile storage device, and thus transform the state of the non-volatile storage device, the state of display subsystem 508 may likewise be transformed to visually represent changes in the underlying data. Display subsystem 508 may include one or more display devices utilizing virtually any type of technology. Such display devices may be combined with logic processor 502, volatile memory 504, and/or non-volatile storage device 506 in a shared enclosure, or such display devices may be peripheral display devices.

When included, input subsystem 510 may comprise or interface with one or more user-input devices such as a keyboard, mouse, touch screen, microphone for speech and/or voice recognition, a camera (e.g., a webcam), or game controller.

When included, communication subsystem 512 may be configured to communicatively couple various computing devices described herein with each other, and with other devices. Communication subsystem 512 may include wired and/or wireless communication devices compatible with one or more different communication protocols. As non-limiting examples, the communication subsystem may be configured for communication via a wireless telephone network, or a wired or wireless local- or wide-area network, such as a HDMI over Wi-Fi connection. In some implementations, the communication subsystem may allow computing system 500 to send and/or receive messages to and/or from other devices via a network such as the Internet.

In an example, a power supply device comprises a voltage source configured to generate an input voltage, a switching converter electrically connected to a switching converter input node that is electrically connected to the voltage source, a first switching node, a second switching node, and a positive-bias output node, the switching converter being configured to switch between an ON state and an OFF state, an inductor electrically connected between the first switching node and the second switching node, and a linear voltage regulator is electrically connected to a linear voltage regulator input node, and a negative-bias output node, wherein the power supply device is configured such that when the switching converter is in the ON state, the inductor is charged with a charging current, wherein the power supply device is configured such that when the switching converter is in the OFF state, the switching converter modulates the input voltage to generate a positive-bias output voltage at the positive-bias output node, and the charging current flows from the inductor such that a negative input voltage is generated at the linear voltage regulator input node, and the linear voltage regulator regulates the negative input voltage to generate a negative-bias output voltage at the negative-bias output node. In this example and/or other examples, the power supply device may further comprise an inverting charge pump electrically connected to the second switching node and configured such that when the switching converter is in the OFF state, the charging current flows from the inductor to the inverting charge pump such that the inverting charge pump generates the negative input voltage at the linear voltage regulator input node. In this example and/or other examples, the inverting charge pump may include 1) a flying capacitor electrically connected between the second switching node and an inverting charge pump node, 2) a first diode electrically connected between the inverting charge pump node and a ground node, 3) a second diode electrically connected between the inverting charge pump node and the linear voltage regulator input node, and 4) a linear voltage regulator input capacitor electrically connected between the linear voltage regulator input node and the ground node. In this example and/or other examples, the inverting charge pump may be configured such that when the switching converter is in the ON state, the flying capacitor is charged with the charging current, and when the switching converter is in the OFF state, the charging current flows from the flying capacitor through the second diode to the linear voltage regulator input capacitor to generate the negative input voltage at the linear voltage regulator input node. In this example and/or other examples, the switching converter may be electrically connected to a switching converter feedback node, and the power supply device may further comprise a feedback resistor divider electrically connected between the positive-bias output node and the switching converter feedback node, and the switching converter may be configured to modulate the positive-bias output voltage based on a feedback voltage measured via the resistor divider. In this example and/or other examples, the linear voltage regulator may be electrically connected to a linear voltage regulator feedback node, the power supply device may further comprise a feedback resistor divider electrically connected between the negative-bias output node and the linear voltage regulator feedback node, and the linear voltage regulator may be configured to regulate the negative-bias output voltage based on a feedback voltage measured via the resistor divider. In this example and/or other examples, the positive-bias output voltage may have a greater absolute value than that of the negative-bias output voltage. In this example and/or other examples, the switching converter may include a buck switching converter. In this example and/or other examples, the switching converter may include a boost switching converter. In this example and/or other examples, the switching converter may include a buck-boost switching converter. In this example and/or other examples, the linear voltage regulator may include a low-dropout voltage regulator. In this example and/or other examples, the positive-bias output node may be electrically connected to a positive-bias input node of a liquid crystal on silicon (LCoS) display, the negative-bias output node may be electrically connected to a negative-bias input node of the LCoS display, and the power supply device may be configured to output the positive-bias output voltage and the negative-bias output voltage to the LCoS display.

In another example, a near-eye display device comprises a liquid crystal on silicon (LCoS) display including a positive-bias input node and a negative-bias input node, and a power supply device comprising a voltage source configured to generate an input voltage, a switching converter electrically connected to a switching converter input node that is electrically connected to the voltage source, a first switching node, a second switching node, and a positive-bias output node electrically connected to the positive-bias input node of the LCoS display, the switching converter being configured to switch between an ON state and an OFF state, an inductor electrically connected between the first switching node and the second switching node, and a linear voltage regulator electrically connected to a linear voltage regulator input node and a negative-bias output node that is electrically connected to the negative-bias input node of the LCoS display, wherein the power supply device is configured such that when the switching converter is in the ON state the inductor is charged with a charging current, and wherein the power supply device is configured such that when the switching converter is in the OFF state, the switching converter modulates the input voltage to generate a positive-bias output voltage at the positive-bias output node, and the charging current flows from the inductor such that a negative input voltage is generated at the linear voltage regulator input node, and the linear voltage regulator regulates the negative input voltage to generate a negative-bias output voltage at the negative-bias output node.

In this example and/or other examples, the power supply device may include an inverting charge pump electrically connected to the second switching node and configured such that when the switching converter is in the OFF state, the charging current flows from the inductor to the inverting charge pump such that the inverting charge pump generates the negative input voltage at the linear voltage regulator input node. In this example and/or other examples, the inverting charge pump may include 1) a flying capacitor electrically connected between the second switching node and an inverting charge pump node, 2) a first diode electrically connected between the inverting charge pump node and a ground node, 3) a second diode electrically connected between the inverting charge pump node and the linear voltage regulator input node, and 4) a linear voltage regulator input capacitor electrically connected between the linear voltage regulator input node and the ground node. In this example and/or other examples, the inverting charge pump may be configured such that when the switching converter is in the ON state, the flying capacitor is charged with the charging current, and when the switching converter is in the OFF state, the charging current flows from the flying capacitor through the second diode to the linear voltage regulator input capacitor to generate the negative input voltage at the linear voltage regulator input node. In this example and/or other examples, the switching converter may be electrically connected to a switching converter feedback node, the power supply device may further comprise a feedback resistor divider electrically connected between the positive-bias output node and the switching converter feedback node, and the switching converter may be configured to modulate the positive-bias output voltage based on a feedback voltage measured via the resistor divider. In this example and/or other examples, the linear voltage regulator may be electrically connected to a linear voltage regulator feedback node, the power supply device may further comprise a feedback resistor divider electrically connected between the negative-bias output node and the linear voltage regulator feedback node, and the linear voltage regulator may be configured to regulate the negative-bias output voltage based on a feedback voltage measured via the resistor divider. In this example and/or other examples, the positive-bias output voltage may have a greater absolute value than that of the negative-bias output voltage.

In yet another example, a method of operating a power supply device, the method comprises generating an input voltage via a voltage source electrically connected to a switching converter input node of a switching converter, operating the switching converter in an ON state based on an operational duty cycle of the power supply device, wherein the power supply device is configured such that when the switching converter is in the ON state an inductor electrically connected between a first switching converter node and a second switching node of the switching converter is charged with a charging current, and operating the switching converter in an OFF state based on the operational duty cycle of the power supply device, wherein the power supply device is configured such that when the switching converter is in the OFF state, the switching converter modulates the input voltage to generate a positive-bias output voltage at a positive-bias output node of the power supply device, and the charging current flows from the inductor such that a negative input voltage is generated at a linear voltage regulator input node of a linear voltage regulator, and the linear voltage regulator regulates the negative input voltage to generate a negative-bias output voltage at a negative-bias output node of the power supply device.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:
1. A power supply device comprising:
a voltage source configured to generate an input voltage;

a switching converter electrically connected to a switching converter input node that is electrically connected to the voltage source, a first switching node, a second switching node, and a positive-bias output node, the switching converter being configured to switch between an ON state and an OFF state;
an inductor electrically connected between the first switching node and the second switching node; and
a linear voltage regulator is electrically connected to a linear voltage regulator input node, and a negative-bias output node;
wherein the power supply device is configured such that when the switching converter is in the ON state, the inductor is charged with a charging current; and
wherein the power supply device is configured such that when the switching converter is in the OFF state, the switching converter modulates the input voltage to generate a positive-bias output voltage at the positive-bias output node, and the charging current flows from the inductor such that a negative input voltage is generated at the linear voltage regulator input node, and the linear voltage regulator regulates the negative input voltage to generate a negative-bias output voltage at the negative-bias output node.

2. The power supply device of claim 1, further comprising:
an inverting charge pump electrically connected to the second switching node and configured such that when the switching converter is in the OFF state, the charging current flows from the inductor to the inverting charge pump such that the inverting charge pump generates the negative input voltage at the linear voltage regulator input node.

3. The power supply device of claim 2, wherein the inverting charge pump includes 1) a flying capacitor electrically connected between the second switching node and an inverting charge pump node, 2) a first diode electrically connected between the inverting charge pump node and a ground node, 3) a second diode electrically connected between the inverting charge pump node and the linear voltage regulator input node, and 4) a linear voltage regulator input capacitor electrically connected between the linear voltage regulator input node and the ground node.

4. The power supply device of claim 3, wherein the inverting charge pump is configured such that when the switching converter is in the ON state, the flying capacitor is charged with the charging current, and when the switching converter is in the OFF state, the charging current flows from the flying capacitor through the second diode to the linear voltage regulator input capacitor to generate the negative input voltage at the linear voltage regulator input node.

5. The power supply device of claim 1, wherein the switching converter is electrically connected to a switching converter feedback node, wherein the power supply device further comprises a feedback resistor divider electrically connected between the positive-bias output node and the switching converter feedback node, and wherein the switching converter is configured to modulate the positive-bias output voltage based on a feedback voltage measured via the resistor divider.

6. The power supply device of claim 1, wherein the linear voltage regulator is electrically connected to a linear voltage regulator feedback node, wherein the power supply device further comprises a feedback resistor divider electrically connected between the negative-bias output node and the linear voltage regulator feedback node, and wherein the linear voltage regulator is configured to regulate the negative-bias output voltage based on a feedback voltage measured via the resistor divider.

7. The power supply device of claim 1, wherein the positive-bias output voltage has a greater absolute value than that of the negative-bias output voltage.

8. The power supply device of claim 1, wherein the switching converter includes a buck switching converter.

9. The power supply device of claim 1, wherein the switching converter includes a boost switching converter.

10. The power supply device of claim 1, wherein the switching converter includes a buck-boost switching converter.

11. The power supply device of claim 1, wherein the linear voltage regulator includes a low-dropout voltage regulator.

12. The power supply device of claim 1, wherein the positive-bias output node is electrically connected to a positive-bias input node of a liquid crystal on silicon (LCoS) display, wherein the negative-bias output node is electrically connected to a negative-bias input node of the LCoS display, and wherein the power supply device is configured to output the positive-bias output voltage and the negative-bias output voltage to the LCoS display.

13. A near-eye display device comprising:
a liquid crystal on silicon (LCoS) display including a positive-bias input node and a negative-bias input node; and
a power supply device comprising:
a voltage source configured to generate an input voltage;
a switching converter electrically connected to a switching converter input node that is electrically connected to the voltage source, a first switching node, a second switching node, and a positive-bias output node electrically connected to the positive-bias input node of the LCoS display, the switching converter being configured to switch between an ON state and an OFF state;
an inductor electrically connected between the first switching node and the second switching node; and
a linear voltage regulator electrically connected to a linear voltage regulator input node and a negative-bias output node that is electrically connected to the negative-bias input node of the LCoS display;
wherein the power supply device is configured such that when the switching converter is in the ON state the inductor is charged with a charging current; and
wherein the power supply device is configured such that when the switching converter is in the OFF state, the switching converter modulates the input voltage to generate a positive-bias output voltage at the positive-bias output node, and the charging current flows from the inductor such that a negative input voltage is generated at the linear voltage regulator input node, and the linear voltage regulator regulates the negative input voltage to generate a negative-bias output voltage at the negative-bias output node.

14. The near-eye display device of claim 13, wherein the power supply device includes an inverting charge pump electrically connected to the second switching node and configured such that when the switching converter is in the OFF state, the charging current flows from the inductor to the inverting charge pump such that the inverting charge pump generates the negative input voltage at the linear voltage regulator input node.

15. The near-eye display device of claim 14, wherein the inverting charge pump includes 1) a flying capacitor electrically connected between the second switching node and an inverting charge pump node, 2) a first diode electrically connected between the inverting charge pump node and a ground node, 3) a second diode electrically connected between the inverting charge pump node and the linear voltage regulator input node, and 4) a linear voltage regulator input capacitor electrically connected between the linear voltage regulator input node and the ground node.

16. The near-eye display device of claim 15, wherein the inverting charge pump is configured such that when the switching converter is in the ON state, the flying capacitor is charged with the charging current, and when the switching converter is in the OFF state, the charging current flows from the flying capacitor through the second diode to the linear voltage regulator input capacitor to generate the negative input voltage at the linear voltage regulator input node.

17. The near-eye display device of claim 13, wherein the switching converter is electrically connected to a switching converter feedback node, wherein the power supply device further comprises a feedback resistor divider electrically connected between the positive-bias output node and the switching converter feedback node, and wherein the switching converter is configured to modulate the positive-bias output voltage based on a feedback voltage measured via the resistor divider.

18. The near-eye display device of claim 13, wherein the linear voltage regulator is electrically connected to a linear voltage regulator feedback node, wherein the power supply device further comprises a feedback resistor divider electrically connected between the negative-bias output node and the linear voltage regulator feedback node, and wherein the linear voltage regulator is configured to regulate the negative-bias output voltage based on a feedback voltage measured via the resistor divider.

19. The near-eye display of claim 13, wherein the positive-bias output voltage has a greater absolute value than that of the negative-bias output voltage.

20. A method of operating a power supply device, the method comprising:
generating an input voltage via a voltage source electrically connected to a switching converter input node of a switching converter;
operating the switching converter in an ON state based on an operational duty cycle of the power supply device, wherein the power supply device is configured such that when the switching converter is in the ON state an inductor electrically connected between a first switching converter node and a second switching node of the switching converter is charged with a charging current; and
operating the switching converter in an OFF state based on the operational duty cycle of the power supply device, wherein the power supply device is configured such that when the switching converter is in the OFF state, the switching converter modulates the input voltage to generate a positive-bias output voltage at a positive-bias output node of the power supply device, and the charging current flows from the inductor such that a negative input voltage is generated at a linear voltage regulator input node of a linear voltage regulator, and the linear voltage regulator regulates the negative input voltage to generate a negative-bias output voltage at a negative-bias output node of the power supply device.

* * * * *